United States Patent [19]

Tokumaru et al.

[11] Patent Number: 5,412,259
[45] Date of Patent: May 2, 1995

[54] INPUT BUFFER WITH LEVEL DETECTOR CIRCUIT

[75] Inventors: Takeji Tokumaru; Mamoru Chiba, both of Kitakami, Japan

[73] Assignee: Kabushiki Kaisha Toshiba, Kawasaki, Japan

[21] Appl. No.: 104,654

[22] Filed: Aug. 11, 1993

[30] Foreign Application Priority Data

Aug. 11, 1992 [JP] Japan .................................. 4-214341

[51] Int. Cl.6 ...................... H03K 17/16; H03K 19/20
[52] U.S. Cl. ...................................... 326/21; 326/121; 326/68; 327/210
[58] Field of Search ............... 307/443, 451, 554, 279; 361/88, 91

[56] References Cited

U.S. PATENT DOCUMENTS

| | | | |
|---|---|---|---|
| 4,342,065 | 7/1982 | Larson | 307/473 |
| 4,760,283 | 7/1988 | Weaver | 307/443 |
| 4,806,786 | 2/1989 | Valentine | 307/451 |
| 5,220,205 | 6/1993 | Shigehara et al. | 307/443 |
| 5,256,914 | 10/1993 | Boomer | 307/443 |

Primary Examiner—Edward P. Westin
Assistant Examiner—Andrew Sanders
Attorney, Agent, or Firm—Foley & Lardner

[57] ABSTRACT

An input buffer circuit with first and second inverters serially connected between an input terminal and an output terminal of the circuit. The input buffer circuit includes a level detector circuit for detecting that the level of a signal inputted to the input terminal is logically unsteady, and an output level holding circuit for detecting the level of a node where the first and second inverters are connected together and controlling the level of the node to maintain the level, when the level detector circuit detects that the level of the signal is logically unsteady.

1 Claim, 1 Drawing Sheet

INPUT BUFFER WITH LEVEL DETECTOR CIRCUIT

BACKGROUND OF THE INVENTION

The present invention relates to an input buffer circuit.

An input buffer circuit for amplifying an externally inputted signal is provided in a semiconductor memory device or the like. A conventional input buffer circuit has the structure such as shown in FIG. 3. An external input terminal IN is connected to an input terminal of a first inverter IV11 whose output terminal is connected to a node NA. This node NA is connected to an input terminal of a second inverter IV12 whose output terminal is connected to an output terminal OUT of this circuit.

In the second inverter IV12, the gate of a P channel transistor P11 and the gate of an N channel transistor N11 are connected to the nodes NA. The source of the P channel transistor P11 is connected via a resistor R11 to a power source voltage Vcc terminal, and the drain thereof is connected to the drain of the N channel transistor N11. The source of the N channel transistor N11 is connected via a resistor R12 to a ground potential Vss terminal. The drains of the P and N channel transistors P11 and N 11 are connected in common to the output terminal OUT.

When a signal of logical level "1" is applied to the external input terminal IN, the logical level of the node NA at the output terminal of the first inverter IV11 becomes "0". With the logical level "0" of the node NA, the P channel transistor P11 of the second inverter IV12 turns on and the N channel transistor N11 turns off, so that a signal of logical level "1" is outputted from the output terminal OUT.

Conversely, when a signal of logical level "0" is applied to the external input terminal IN, the logical level of the node NA at the output terminal of the first inverter IV11 becomes "1". With the logical level "1" of the node NA, the P channel transistor P11 turns off and the N channel transistor N11 turns on, so that a signal of logical level "0" is outputted from the output terminal OUT.

When an unsteady signal having an intermediate level between the logical levels "1" and "0" is applied to the external input terminal IN, the level of the node NA at the output terminal of the first inverter IV11 is also unsteady. If the intermediate level of the node NA between the logical levels "1" and "0" is lower than the threshold voltage Vtp of the P channel transistor P11 and higher than the threshold voltage Vth of the N channel transistor N11, both the transistors turn on. As a result, a signal of unsteady level is outputted from the output terminal OUT.

As discussed above, when a signal of unsteady level is inputted to the external input terminal IN, the serially connected P channel transistor P11 and N channel transistor N11 both turn on. As a result, current flows through the power source voltage Vcc terminal and ground potential Vss terminal, increasing the power consumption more than when a signal of logical level "1" or "0" is inputted.

SUMMARY OF THE INVENTION

It is therefore an object of the present invention to provide an input buffer circuit capable of reducing the power consumption even if a signal of unsteady level is inputted.

According to the present invention, there is provided an input buffer circuit with first and second inverters serially connected between an input terminal and an output terminal of the circuit, comprising: a level detector circuit for detecting that the level of a signal inputted to the input terminal is logically unsteady; and an output level holding circuit for detecting the level of a node where the first and second inverters are connected together and controlling the level of the node to maintain the level, when the level detector circuit detects that the level of the signal is logically unsteady.

If a signal inputted to the external input terminal is logically unsteady, the level detector circuit detects it and the output level holding circuit detects the level of the output terminal and controls the level of the node where the first and second inverters are connected together to maintain outputting the level of the output terminal. Therefore, the second inverter takes a state where a logically steady signal is inputted to the external input terminal, reducing the power consumption by preventing a flow of through current.

In one of the preferred embodiments, the second inverter includes a first P channel transistor and a first N channel transistor serially connected between a power source voltage terminal and a ground potential terminal, the drains of the first P and N channel transistors being connected in common to the output terminal, and the gates of the first P and N channel transistors being connected in common to the output terminal. The level detector circuit includes a second P channel transistor and a second N channel transistor serially connected between the power source voltage terminal and the ground potential terminal, the drains of the second P and N channel transistors being connected in common to a first node, and the gates of the second P and N channel transistors being connected in common to the source of the first N channel transistor. The output level holding circuit includes third and fourth P channel transistors and third and fourth N channel transistors connected in this order between the power source voltage terminal and the ground potential terminal, and a third inverter having an input terminal connected to the first node. The gate of the third P channel transistor is connected to the first node, the gates of the fourth P channel transistor and the third N channel transistor are connected in common to the output terminal, the gate of the fourth N channel transistor is connected to the output terminal of the third inverter, and the drains of the fourth P channel transistor and the third N channel transistor are connected in common to the gates of the first P channel transistor and the first N channel transistor.

When a signal of logically unsteady level is inputted to the external input terminal, the first inverter outputs a signal of unsteady level and transfers this signal to the second inverter. Therefore, both the first P and N channel transistors of the second inverter turn on to raise the level of the source of the second N channel transistor. This raised level is inputted to the gates of the second P and N channel transistors of the level detector circuit, so that the second P channel transistor turns off and the second N channel transistor turns on. As a result, the level of the first node where the drains of the second P and N channel transistors are connected together takes the low level. The third P channel transistor whose gate is connected to the first node turns on, and the forth N channel transistor whose gate is connected via the third inverter to the first node turns on. Accordingly, of the third and fourth P channel transistors and the third and fourth N channel transistors serially connected between the power source voltage terminal and the ground potential terminal, the third P channel transistor and the fourth N channel transistor turn on. Therefore, the level of the node where the drains of the fourth P channel transistor and the third N channel transistor is determined by the level of the output terminal where the gates of the fourth P channel transistor and the third N channel transistor are connected together. If the level of the output terminal is high level, the fourth P channel transistor turns off and the third N channel transistor turns on, so that the potential of the node where both the drains are connected together becomes low level and this low level is applied to the input terminal of the second inverter. Conversely, if the level of the output terminal is low level, the fourth P channel transistor turns on and the third N channel transistor turns off, so that the potential of the node where both the drains are connected together becomes high level and this high level is applied to the input terminal of the second inverter. As a result, only one of the first P and N channel transistors of the second inverter turns on, preventing a flow of through current and reducing the power consumption.

DESCRIPTION OF THE PREFERRED EMBODIMENTS

Preferred embodiments of the present invention will be described with reference to the accompanying drawings.

Figure 1:
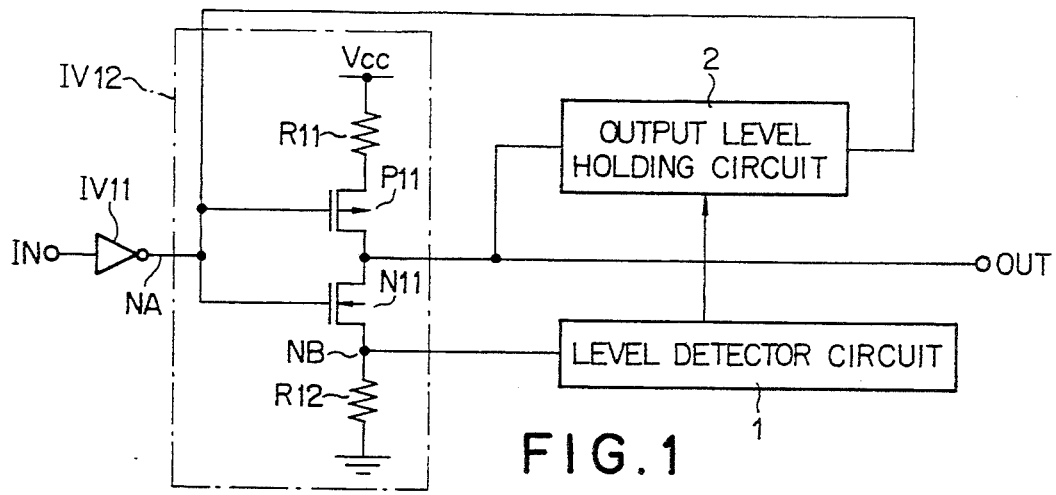
FIG. 1 is a circuit diagram showing the structure of an input buffer circuit according to a first embodiment of the present invention.

FIG. 1 shows the structure of an input buffer circuit according to a first embodiment of the present invention.

Figure 3:
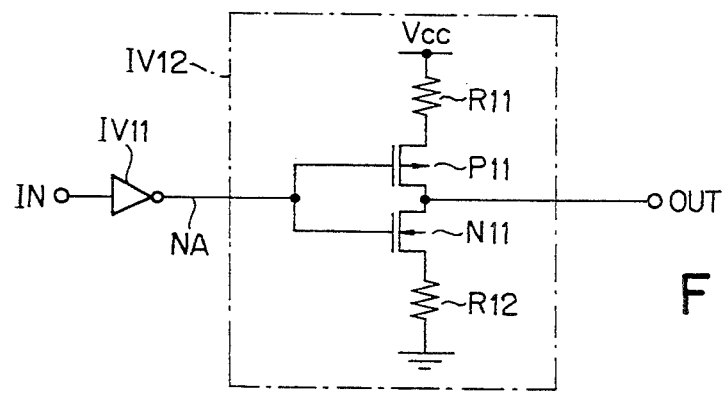
FIG. 3 is a circuit diagram showing the structure of a conventional input buffer circuit.

In the circuit of this embodiment, there are provided a level detector circuit 1 and an output level holding circuit 2 along with the circuit shown in FIG. 3. The level detector circuit 1 has its input terminal connected to a node NB where the source of the N channel transistor N11 and the resistor R12 are connected together, and its output terminal connected to a control terminal of the output level holding circuit 2. The output level holding circuit 2 has its input terminal connected to the output terminal OUT and its output terminal connected to both the gates of the P and N channel transistors P11 and N11. Other elements similar to those shown in FIG. 3 are represented by identical designations, and the description thereof is omitted.

The operation of the first embodiment constructed as above will be described below. When a signal of logical level "1" or "0" is inputted to the external input terminal IN, current scarcely flows from the node NB to the resistor R12 and the level of the node NB is almost the same as the ground potential Vss, i.e., the logical level "0". The level detector circuit 1 detects that the level of the node NB is substantially the same as the ground potential Vss. In this case where the normal signal is inputted to the external input terminal IN, the level detector circuit 1 controls the output level holding circuit 2 not to operate and affect the potential of the gates of the P and N channel transistors P11 and N11. As a result, the input buffer circuit operates in the same manner as the conventional circuit shown in Fig. 3.

The operation when a signal of unsteady level between the logical levels "1" and "0" is applied to the input terminal IN will be described below. When a signal of unsteady level is inputted to the input terminal IN, the node NA takes also an unsteady level so that both the P and N channel transistors P11 and N11 temporarily turn on and through current will flow. Since current flows from the node NB to the resistor R12, the level of the node NB rises slightly toward the logical level "1".

When the level of the node NB rises, the level detector circuit 1 detects from this level change of the node NB that a signal of unsteady level was inputted to the external input terminal IN. The level detector circuit 1 controls the output level holding circuit 2 to hold the output level at the output terminal OUT. Namely, the output level holding circuit 2 detects the output level at the output terminal OUT at this time instant and a signal having an inverted output level is applied to the gates of the P and N channel transistors P11 and N11 to maintain the detected output level at the output terminal OUT. As a result, the input buffer circuit takes the state where one of the P and N channel transistors P11 and N11 turns on when a signal of logical levels "1" or "0" is inputted before the signal of unsteady level is inputted to the external input terminal IN. As a result, the through current will not flow in the P and N channel transistors P11 and N11, preventing an increase of the power consumption.

Figure 2:
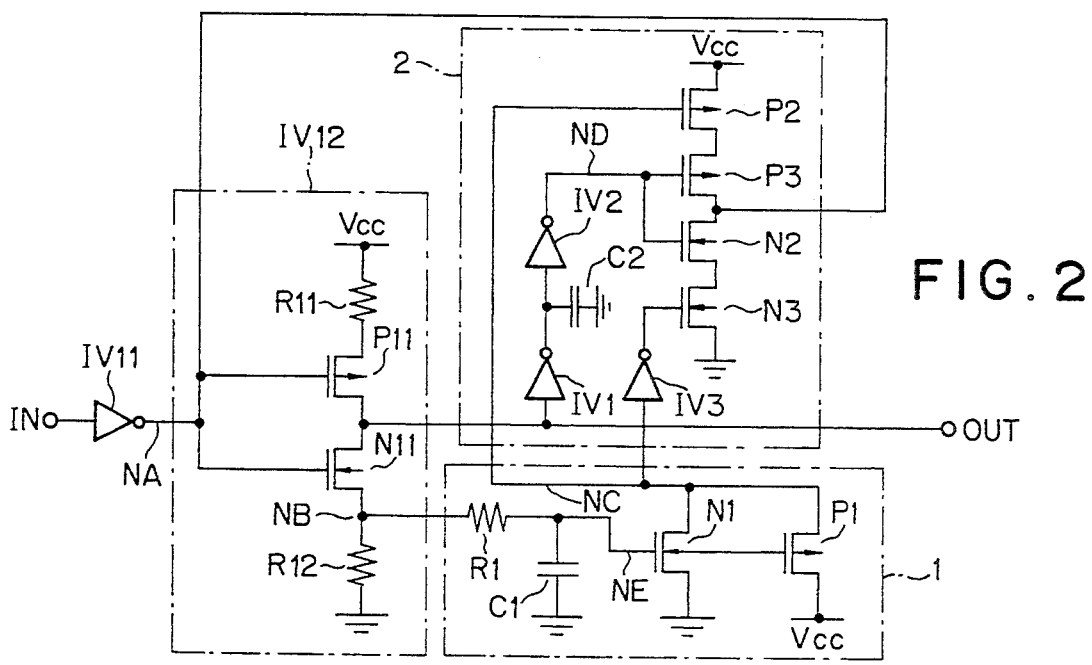
FIG. 2 is a circuit diagram showing the structure of an input buffer circuit according to a second embodiment of the present invention.

Next, an input buffer circuit according to a second embodiment of the present invention will be described with reference to FIG. 2. This second embodiment circuit is a more specified version of the first embodiment circuit. The level detector circuit 1 is constituted by a resistor R1, a capacitor C1, an N channel transistor N1, and a P channel transistor P1. The output level holding circuit 2 is constituted by inverter IV1 to IV3, a capacitor C2, N channel transistors N2 and N3, and P channel transistors P2 and P3.

In the level detector circuit 1, one end of the resistor R1 is connected to the node NB where the source of the N channel transistor N11 and the resistor R12 are connected together, and the other end of the resistor R1 is connected to the gates of the N and P channel transistors N1 and P1. One end of the capacitor C1 is connected to a node NE where the other end of the resistor R1 and the gate of the N channel transistor N1 are connected together, and the other end of the capacitor C1 is grounded. The drains of the N and P channel transistors N1 and P1 are both connected to a node NC. The source of the N channel transistor N1 is connected to the ground potential Vss terminal, and the source of the P channel transistor P1 is connected to the power source voltage Vcc terminal.

The node NC is connected to the control terminal of the output level holding circuit 2, and the input terminal of the inverter IV3 corresponds to the control terminal of the circuit 2. The serially connected two inverters IV1 and IV2 are connected to the output terminal OUT. One end of the capacitor C2 is connected between the output terminal of the inverter IV1 and the input terminal of the inverter IV2, and the other end of the capacitor C2 is grounded.

The P channel transistors P2 and P3 and N channel transistors N2 and N3 are serially connected between the power source voltage Vcc terminal and ground potential Vss terminal. The gate of the P channel transistor P2 is connected to the node NC. The gates of the P and N channel transistors P3 and N2 are connected to a node ND. The gate of the N channel transistor N3 is connected to the output terminal of the inverter IV3.

Equivalent elements to those in the conventional circuit are represented by using identical designations, and the description thereof is omitted.

The operation of the second embodiment constructed as above will be described below. When a signal of logical level "1" or "0" is inputted to the external input terminal IN, as described with the first embodiment, the level of the node NB is almost the same as the ground potential Vss, i.e., the logical level "0". The level of the node NE is therefore almost the same as the logical level "0", and so the N channel transistor N1 turns off and the P channel transistor P1 turns on. As a result, the level of the node NC takes the logical level "1", and the P and N channel transistors P2 and N3 both turn off. The input buffer circuit therefore operates in the same manner as the conventional circuit shown in FIG. 3, without affecting the operation of the P channel and N channel transistors P11 and N11.

When a signal of unsteady level between the logical levels "1" and "0" is inputted to the external input terminal IN, the node NA takes also an unsteady level so that both the P and N channel transistors P11 and N11 temporarily turn on and through current will flow. Since current flows from the node NB to the resistor R12, the level of the node NB rises slightly toward the logical level "1".

When the level of the node NB rises, current passed through the resistor R1 charges the capacitor C1 to raise the level of the node NE near to the logical level "1". The voltage at the node NE is applied to the gates of the N and P channel transistors N1 and P1 to turn on and off, respectively, so that the level of the node NC takes the logical level "0".

As a result, both the P and N channel transistors P2 and N3 turn on. One of the P and N channel transistors P3 and N2 serially connected between the P and N channel transistors P2 and N3 turns on depending upon the level of the node ND.

The level of the node ND is determined by the level of the signal previously delivered to the output terminal OUT. If this previous output signal takes the logical level "1", this signal is delayed by the inverter train IV1 and IV2 and transferred to the node ND. As a result, the P channel transistor P3 turns off and the N channel transistor N2 turns on, so that the node NA takes the logical level "0". In this manner, the level of the output terminal OUT maintains the logical level "1" same as the level of the previous output signal.

If on the other hand the previous output signal takes the logical level "0", the level of the node ND takes the logical level "0" so that the P channel transistor P3 turns on and the N channel transistor N2 turns off. As a result, the node NA takes the logical level "1". In this manner, the level of the output terminal OUT maintains the logical level "0" same as the level of the previous output signal.

According to this embodiment, even if a signal of unsteady level is inputted, the previous output signal is maintained while turning on one of the P and N channel transistors P11 and N11. As a result, the through current will not flow in the P and N channel transistors P11 and N11, preventing an increase of the power consumption otherwise caused by application of a signal of unsteady level.

The above-described embodiments have been given illustratively, and are not intended to limit the scope of the present invention. For instance, the level detector circuit 1 and output level holding circuit 2 of the first embodiment may be different from the second embodiment circuits, only if the level detector circuit 1 can detect that an input signal has an unsteady level and the output level holding circuit 2 can operate to maintain the level of the output terminal. The resistor R1 and capacitors C1 and C2 shown in FIG. 2 may be discrete elements as in the embodiment, or parasitic elements of wiring.

In the second embodiment, the inverters IV1 and IV2 are provided for delaying the timings of inputting the level of the output terminal OUT to the gates of the P and N channel transistors P3 and N3 for the stable operation of the circuit without malfunction. The inverters IV1 and IV2 are not necessary if a desired delay time is ensured by parasitic capacitance and resistance of wiring interconnecting the output terminal OUT and the gates of the P and N channel transistors P3 and N2.

What is claimed is:

1. An input buffer circuit comprising
   first and second inverters serially connected between an input terminal and an output terminal of the input buffer circuit, said second inverter including a first P channel transistor and a first N channel transistor serially connected between a power source voltage terminal and a ground potential terminal, drains of said first P and N channel transistors being connected in common to said output terminal of the input buffer circuit, and gates of said first P and N channel transistors being connected in common to an output terminal of said first inverter;
   a level detector circuit for detecting that a level of a signal inputted to said input terminal is unsteady and outputting a detecting signal, said level detector circuit including a second P channel transistor and a second N channel transistor serially connected between said power source voltage terminal and said ground potential terminal, drains of said second P and N channel transistors being connected in common to a first node, and gates of said second P and N channel transistors being connected in common to a source of said first N channel transistor; and
   an output level holding circuit for detecting a level of a node where said first and second inverters are connected together and controlling said level of said node to maintain said level of said node when said output level holding circuit receives the detecting signal outputted from said level detector circuit, said output level holding circuit including third and fourth P channel transistors and third and fourth N channel transistors respectively connected in series between said power source voltage terminal and said ground potential terminal, and a third inverter having an input terminal connected to said first node, a gate of said third P channel transistor being connected to said first node; gates of said fourth P channel transistor and said third N channel transistor being coupled in common to said output terminal of said input buffer circuit, a gate of said fourth N channel transistor being connected to an output terminal of said third inverter, and drains of said fourth P channel transistor and said third N channel transistor being connected in common to the gates of said first P channel transistor and said first N channel transistor.

* * * * *